(12) United States Patent
Chen et al.

(10) Patent No.: US 7,079,433 B1
(45) Date of Patent: Jul. 18, 2006

(54) WAFER LEVEL BURN-IN OF SRAM

(75) Inventors: Chih-Hung Chen; Te-Sun Wu, both of Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 58 days.

(21) Appl. No.: 09/860,971

(22) Filed: May 18, 2001

(51) Int. Cl.
*G11C 7/00* (2006.01)

(52) U.S. Cl. .................... 365/201; 438/14; 365/233; 365/190; 365/208; 365/207

(58) Field of Classification Search ............... 438/14; 365/233, 190, 208, 207, 201
See application file for complete search history.

(56) References Cited

U.S. PATENT DOCUMENTS

| | | | | |
|---|---|---|---|---|
| 6,038,183 A | * | 3/2000 | Tsukude | .................. 365/201 |
| 6,198,682 B1 | * | 3/2001 | Proebsting | .................. 365/207 |
| 6,205,067 B1 | * | 3/2001 | Tsukude | .................. 365/201 |
| 6,208,575 B1 | * | 3/2001 | Proebsting | .................. 365/208 |
| 6,212,109 B1 | * | 4/2001 | Proebsting | .................. 365/190 |
| 6,240,046 B1 | * | 5/2001 | Proebsting | .................. 365/233 |

* cited by examiner

*Primary Examiner*—John F. Niebling
*Assistant Examiner*—Andre' C Stevenson
(74) *Attorney, Agent, or Firm*—Charles C. H. Wu; Charles C. H. Wu & Associates

(57) ABSTRACT

A wafer level burn-in method for static-random access memory. The SRAM memory has a plurality of word lines and a plurality of bit lines. The SRAM memory also has pull up circuits and equalizer circuits connected to various bit lines. All the word lines are switched on for testing any leakage in the gate dielectric layer. A high potential is applied to a bit line of every bit line pairs and a low potential is applied to the other bit line of the bit line pairs. The pull-up circuits and the equalizer circuits are shut down. The current at a steady state is used to judge the normality of an SRAM chip.

20 Claims, 3 Drawing Sheets

WAFER LEVEL BURN-IN OF SRAM

BACKGROUND OF THE INVENTION

1. Field of Invention

The present invention relates to an inspection method for a semiconductor device. More particularly, the present invention relates to a wafer level burn-in for static random access memory (SRAM).

2. Description of Related Art

Static random access memory (SRAM) is frequently used in high-speed data access circuits such as the cache memory of a central processing unit (CPU). Because the fabrication of SRAM involves a large number of complicated steps, a burn-in testing of the SRAM product is necessary before shipment to customers. A burn-in test is a quick way of assessing the quality of an electronic product by subjecting the product to particularly stringent operating conditions. Any products that are not up to standard and likely to fail can be determined through the test and subsequently removed. Burn-in testing is conducted by applying a voltage at the gate terminal of a metal-oxide-semiconductor (MOS) transistor within an SRAM cell so that quality of the gate dielectric layer can be assessed, while finding out the SRAM cell with a defective gate dielectric layer. Furthermore, a potential is frequently applied to neighboring conductive lines so that short-circuiting can be found. The particular chips that cannot pass such tests are removed. In general, most short-circuiting problems occur due to faulty metallic interconnections. The most common reason for such short-circuiting includes an inferior glue layer surrounding a metal via so that metallic material is spread out. Hence, a non-planar substrate is produced leading to inaccuracy in subsequent patterning of conductive lines.

Conventionally, the burn-in of SRAM chips is conducted after packaging. However, the whole package has to be discarded once burn-in test fails. Due to the high level of integration in each SRAM product, cost of producing a package is also very high. Hence, throwing away a packaged product is a highly uneconomical move. Moreover, the conventional burn-in method includes switching various word lines and bit lines of a SRAM chip on and off sequentially. Hence, the burn-in process is rather slow and may take a few hours to complete. Furthermore, burn-in time also increases with the level of integration inside the SRAM chip.

SUMMARY OF THE INVENTION

Accordingly, one object of the present invention is to provide a wafer level burn-in method for static-random access memory (SRAM). The SRAM is tested in the wafer stage. The SRAM memory has a plurality of word lines and a plurality of bit lines. The SRAM memory also has pull up circuits and equalizer circuits connected to various bit lines. The method includes the following steps. First, all the word lines are switched on to test any leakage in the gate dielectric layer. A high potential is applied to the bit line of every bit line pairs and a low potential is applied to the other bit line of the bit line pairs to test the quality of the bit lines and any dielectric layer in-between. The pull-up circuits and the equalizer circuits are shut down so that power loss through direct current during testing is reduced. The current at a steady state is used to judge the normality of the SRAM chip. Hence, any non-standard products can be removed before packaging.

In this invention, the SRAM chips are burn-in tested in the wafer stage, before the chips are packaged. Hence, any failed chips will not be packaged. In addition, all the word lines are switched on simultaneously and a potential is applied to each pair of bit lines at the same time instead of the conventional line scanning method. Thus, various devices within a chip can be checked to single out faulty components within shorter period.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
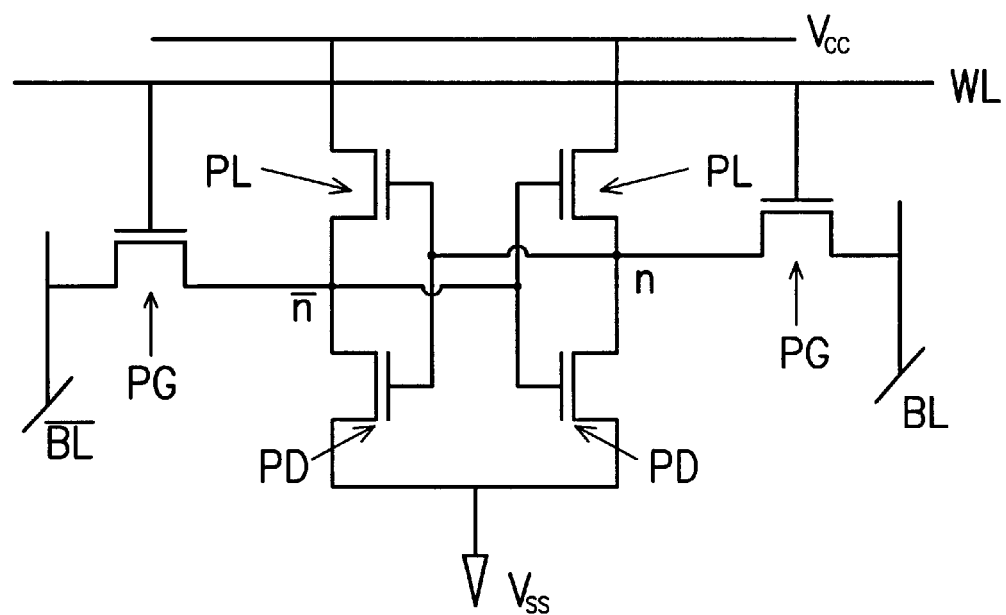
FIG. 1 is a schematic circuit diagram of a six-transistor (6T) static random access memory (SRAM) unit.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a schematic circuit diagram of a six-transistor (6T) static random access memory (SRAM) unit. According to functions, the six transistors in FIG. 1 can be divided into voltage pull-down (PD) devices, PMOS load devices (PL) and pass gate devices (PG). The drain terminal of the PMOS load devices PL are connected to a voltage terminal Vcc and the source terminal of the pull-don devices PD are connected to a voltage terminal Vss. The gate terminal of the pass gate devices PG are connected to a word line WL and the drain terminal of the pass gate devices PG are connected to bit lines BL and $\overline{BL}$ respectively.

Figure 2:
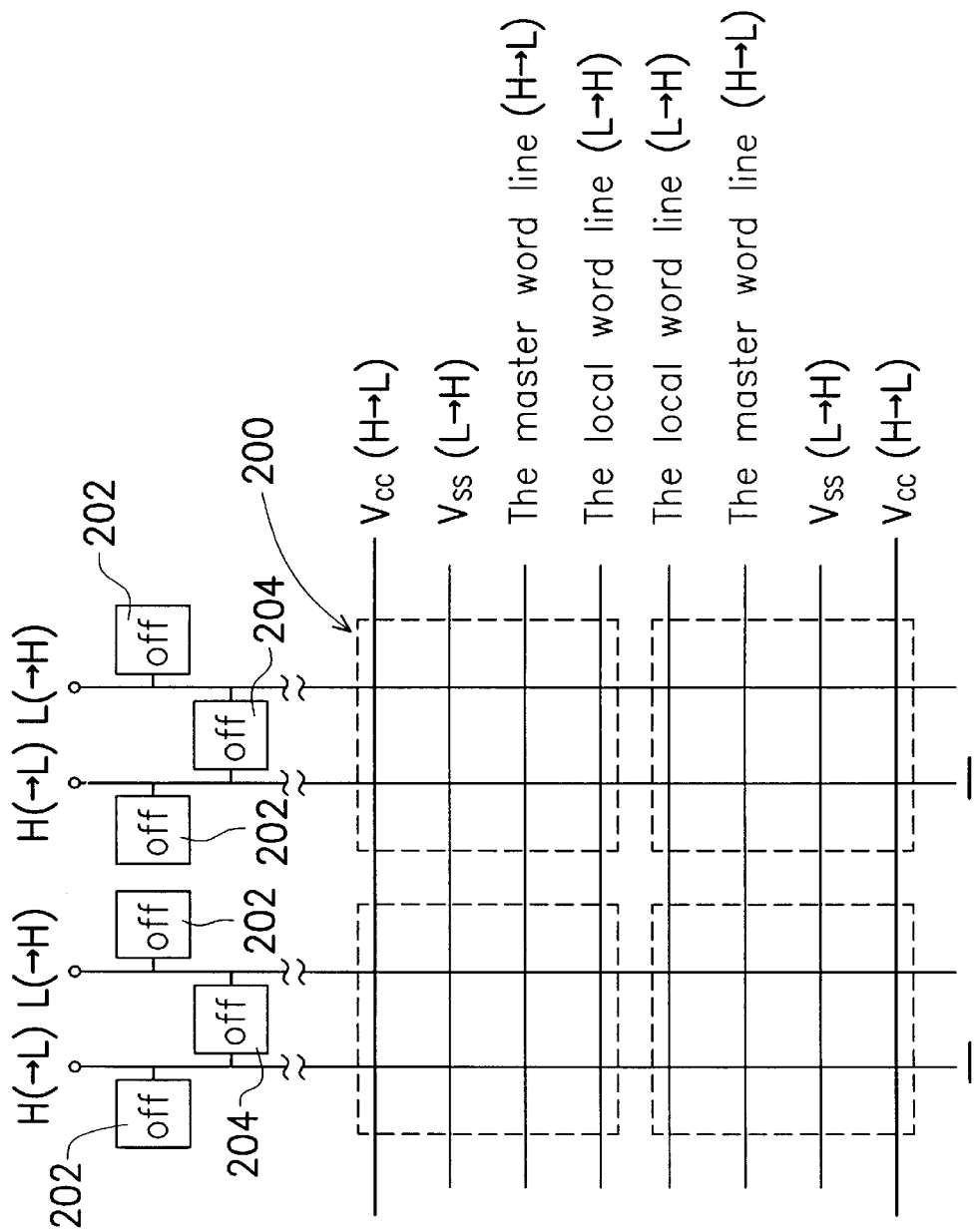
FIG. 2 is a schematic circuit diagram of the connections between bit lines, pull-up circuits, equalizer circuits, word lines and various conductive layers for conducting SRAM burn-in according to one preferred embodiment of this invention.

FIG. 2 is a schematic circuit diagram of the connections between bit lines, pull-up circuits, equalizer circuits, master word lines, conductive lines Vcc and Vss and local word lines for conducting SRAM burn-in according to one preferred embodiment of this invention. As shown in FIG. 2, each bit line BL/$\overline{BL}$ is connected to a pull-up circuit 202 and each pair of bit line BL and an equalizer circuit 204 is formed between each pair of bit lines BL and $\overline{BL}$. The pull-up circuit 202 is a device for rapidly increasing the potential at a particular bit line to the operating voltage Vcc necessary for operating a SRAM unit. The equalizer circuit 204 is a device for adjusting the potential of a pair of bit lines BL and $\overline{BL}$ to ½ Vcc during word line switching so that data loss is prevented.

The master word lines, the conductive lines Vcc, the conductive lines Vss and the local word lines are all formed in the same layer parallel to each other. The master word line passes through the entire memory array. On the other hand, each local word line only connects with the gate of the pass gate devices PG within a plurality of memory cells in a memory block. In reality, the local word lines are similar in function to the word lines in FIG. 1. The local word lines may also connect with additional drivers (not shown) for compensating the voltage attenuation in the master word lines. Here, the four types of conductive lines are shown to arrange in the order Vcc conductive line, Vss conductive line, master word line, local word line, master word line, Vss conductive line and Vcc conductive line.

The burn-in method of this invention includes applying a low voltage and a high voltage to the bit lines BL and $\overline{BL}$ of every bit line pair. The high voltage and low voltage bit lines are alternately positioned so that a direct current differential exists between various bit lines. The high voltage may be, for example, 1.2–1.5 times the normal operating voltage of an SRAM unit and the low voltage may be, for example, 0V. Ambient temperature during burn-in may be set to about 90° C. to 125° C., for example. More stringent operating conditions are set during burn-in because any hidden defects will appear faster so that possible short circuit chips may be singled out within a reasonably short period.

Note that according to FIG. 1, when a low voltage is applied to the bit line BL and a high voltage is applied to the bit line $\overline{BL}$, no current flows to the conductive line Vss. Hence, if there is no short circuiting between every pair of bit lines BL and $\overline{BL}$, current from the bit line BL/$\overline{BL}$ to the conductive line Vss should be zero in the steady state (all bit lines charged to respective potentials). In other words, if some current still flows from the bit line BL/$\overline{BL}$ to the conductive line Vss after settling to the steady state, short-circuiting occurs between at least one pair of bit lines BL and $\overline{BL}$. Since a potential is set up between every pair of bit lines at the same time, a burn-in period of only few seconds is required to simulate the actual operating conditions of an SRAM chip.

Moreover, short-circuiting may occur only in a single direction. To find the exact hidden defect, the original high potential and low potential applied to the respective bit lines may be reversed so that a reverse voltage differential may be established. Ultimately, size of the current after settling to a steady state can be use to decide if the test chip is faulty or not.

In the following, voltages applied to the master lines, the Vcc conductive lines, the Vss conductive lines and the local word line during burn-in are briefly described. The principle behind these setups is to establish a voltage differential between neighboring conductive lines so that any short-circuiting between various conductive lines can be found.

As shown in FIG. 2, the conductive line Vcc has a high potential (labeled 'H'), the conductive line Vss has a low potential (L), the master word line has a high potential (H) and the local word line has a low potential (L) controlled through a driver. With this arrangement, a voltage differential is set up between the conductive line Vcc and the conductive line Vss, between the conductive line Vss and the master word line and between the master word line and the local word line. Similarly, after the currents flowing within a test SRAM chip settle down to a steady state, size of current can be used to decide any short-circuiting between various conductive lines. In addition, directionality of a particular shorting circuit may also be considered by performing the burn-in test again with the original high and low voltages applied to the various conductive lines all reversed.

Figure 3:
FIG. 3 is block diagram showing the connections between a power source, a current limiting device and a SRAM chip for conducting SRAM burn-in according to one preferred embodiment of this invention.
Figure 4:
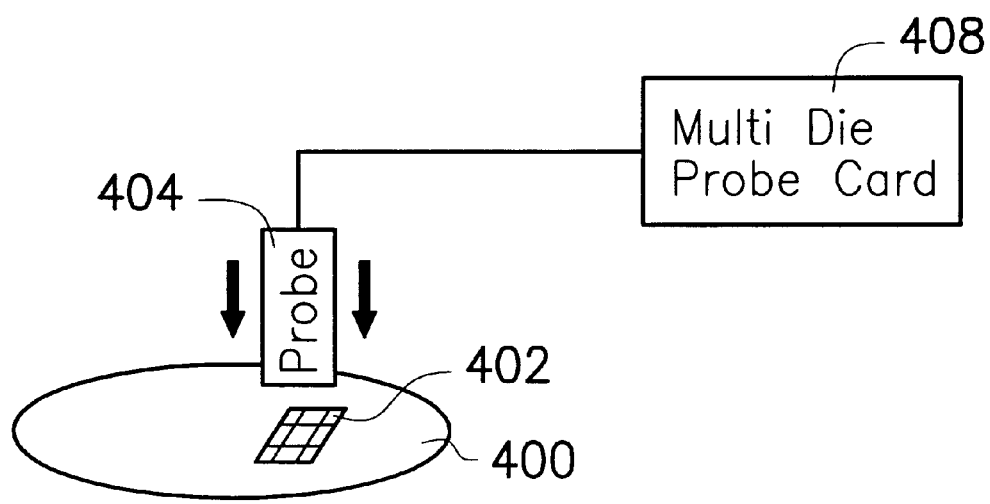
FIG. 4 is a sketch showing the positioning of a multi-die probe card/multi-die probe and a wafer for conducting SRAM burn-in according to one preferred embodiment of this invention.

In addition, the testing system for conducting burn-in test may incorporate additional protective devices. Furthermore, a plurality of chips may be tested concurrently to increase efficiency. FIGS. 3 and 4 below are further illustration of this concept.

FIG. 3 is block diagram showing the connections between a power source, a current limiting device and a SRAM chip for conducting SRAM burn-in according to one preferred embodiment of this invention. As shown in FIG. 3, the current-limiting device is inserted between the power source and the SRAM test chip. The current-limiting device can be a metal-oxide-semiconductor (MOS) transistor with a large channel width, for example. The current-limiting device is necessary because all the word lines and the bit lines are charged at the same time. If the power source and the SRAM test chip are directly connected together, the transient surge in current before the steady state may be too large and cause some damages to the devices. Although the current-limiting device may increase charging time of word lines/bit lines, the increase is only at most 0.1 second compared with the burn-in duration of about few seconds. Hence, such a delay is acceptable.

FIG. 4 is a sketch showing the positioning of a multi-die probe card/multi-die probe and a wafer for conducting SRAM burn-in according to one preferred embodiment of this invention. To save some burn-in time, multiple SRAM chips on a wafer 400 may be burn-in using a multi-die probe card 408 and a multi-die probe 404. Most multi-die probe 404 has 48 pins with every six pins forming a group for testing a chip. Hence, eight chips can be tested simultaneously with an eight-fold increase in efficiency compared with a single chip mode.

In summary, advantages of the SRAM chip burn-in according to this invention include:
1. A burn-in test is conducted before packaging. Hence, packaging cost of a faulty chip is saved.
2. All the word lines are switched on and a voltage differential is set up at every pair of bit lines at the same time unlike a conventional scanning method. Hence, currents in the steady state can be measured and any defects in the chip can be found within a short period.
3. Due to the application of voltage differentials between various conductive lines, quality of these conductive lines and the dielectric materials used to separate these conductive lines can be assessed.
4. By using a multi-die probe card and a multi-die probe to test a wafer, burn-in time and cost is further reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A wafer level burn-in for static random access memory, wherein the static random access memory has a plurality of word lines, a plurality of bit lines and a plurality of pull-up circuits and equalizer circuits connected to the bit lines, the burn-in test comprising:
   switching on all word lines of the static random access memory;
   shutting down all the pull-up circuits and the equalizer circuits;

setting a high voltage at one bit line of every bit line pair and setting a low voltage at another bit line of every bit line pair; and determining normality of a static random access memory according to an eventual current at an end of a first steady state.

2. The wafer level burn-in method of claim 1, wherein the burn-in test further includes:

changing the bit lines originally having a high potential to a low potential and changing the bit lines originally having a low potential to a high potential; and determining normality of the static random access memory according to an eventual current at an end of a second steady state.

3. The wafer level burn-in method of claim 1, wherein the high potential is about 1.2 to 1.5 times a normal operating voltage of the static random access memory and the low potential is at zero voltage.

4. The wafer level burn-in method of claim 1, wherein the burn-in test is carried out at an ambient temperature of about 90° C. to 125° C.

5. The wafer level burn-in method of claim 1, wherein each burn-in operation tests a plurality of static random access memory chips on a wafer simultaneously.

6. The wafer level burn-in method of claim 5, wherein a device for conducting the burn-in test includes a multi-die probe card and a 48-pin multi-die probe so that eight static random access memory chips can be tested concurrently.

7. The wafer level burn-in method of claim 1, wherein the wafer level burn-in of the static random access memory chips is driven by a power source and the power source is connected to the static random access memory via a current-limiting device.

8. The wafer level burn-in method of claim 7, wherein the current-limiting device includes a metal-oxide-semiconductor (MOS) transistor.

9. The wafer level burn-in method of claim 1, wherein the burn-in operation takes about 3 seconds.

10. A wafer level burn-in method for a static random access memory having a plurality of parallel master word lines, a plurality of local word lines, a plurality of conductive lines Vcc and a plurality of conductive lines Vss all on a same layer as well as a plurality of bit lines on another layer, wherein the master word lines, the local word lines, the conductive lines Vcc and the conductive lines Vss are arranged in a specified sequence, and moreover, the bit lines are connected to a plurality of pull-up circuits and a plurality of equalizer circuits, wherein the wafer level burn-in method includes:

shutting all the pull-up circuits and the equalizer circuits;

applying a high voltage to a bit line of every bit line pair and applying a low voltage to another bit line of the bit line pair;

applying a high voltage and a low voltage between any neighboring combinations of the master word lines, the local word lines, the conductive lines Vcc and the conductive lines Vss; and determining normality of a static random access memory according to an eventual current at an end of a first steady state.

11. The wafer level burn-in method of claim 10, wherein the method further includes:

applying a high voltage to the conductive lines such as the word lines, the local word lines, the conductive lines Vcc and the conductive lines Vss originally having a low voltage and applying a low voltage to the conductive lines originally having a high voltage; and determining normality of a static random access memory according to an eventual current at an end of a second steady state.

12. The wafer level burn-in method of claim 10, wherein the master word line, the local word lines, the conductive lines Vcc and the conductive lines Vss are arranged in the following sequence: a conductive line Vcc-a conductive line Vss-a master word line-a local word line-another local word line-another master word line-another conductive line, the sequence then being repeated.

13. The wafer level burn-in method of claim 12, wherein the master word lines have a high potential, the local word lines have a low potential, the conductive lines Vcc have a high potential and the conductive lines Vss have a low potential.

14. The wafer level burn-in method of claim 10, wherein the high potential is about 1.2 to 1.5 times normal operating voltage of the static random access memory and the low potential is at zero voltage.

15. The wafer level burn-in method of claim 10, wherein the burn-in test is carried out at an ambient temperature of about 90° C. to 125° C.

16. The wafer level burn-in method of claim 10, wherein each burn-in operation tests a plurality of static random access memory chips on a wafer simultaneously.

17. The wafer level burn-in method of claim 16, wherein a device for conducting the burn-in test includes a multi-die probe card and a 48-pin multi-die probe so that eight static random access memory chips can be tested concurrently.

18. The wafer level burn-in method of claim 10, wherein the wafer level burn-in of the static random access memory chips is driven by a power source and the power source is connected to the static random access memory via a current-limiting device.

19. The wafer level burn-in method of claim 18, wherein the current-limiting device includes a metal-oxide-semiconductor (MOS) transistor.

20. The wafer level burn-in method of claim 10, wherein the burn-in operation takes about 3 seconds.

* * * * *